(12) United States Patent
Boyd

(10) Patent No.: US 12,402,271 B2
(45) Date of Patent: Aug. 26, 2025

(54) APPLIANCE IMMERSION COOLING SYSTEM

(71) Applicant: Midas Green Technologies, LLC, Austin, TX (US)

(72) Inventor: Christopher L. Boyd, Austin, TX (US)

(73) Assignee: MIDAS GREEN TECHNOLOGIES, LLC, Austin, TX (US)

( * ) Notice: Subject to any disclaimer, the term of this patent is extended or adjusted under 35 U.S.C. 154(b) by 88 days.

(21) Appl. No.: 17/035,343

(22) Filed: Sep. 28, 2020

(65) Prior Publication Data

US 2022/0104394 A1  Mar. 31, 2022

Related U.S. Application Data

(63) Continuation of application No. 16/243,732, filed on Jan. 9, 2019, now Pat. No. 10,820,446, which is a
(Continued)

(51) Int. Cl.
*H01L 23/44* (2006.01)
*H05K 7/20* (2006.01)

(52) U.S. Cl.
CPC ..... *H05K 7/20236* (2013.01); *H05K 7/20272* (2013.01); *H05K 7/20281* (2013.01); *H05K 7/20936* (2013.01)

(58) Field of Classification Search
CPC ............... H05K 7/203; H05K 7/20281; H05K 7/20272; H05K 7/20263; H05K 7/20236
(Continued)

(56) References Cited

U.S. PATENT DOCUMENTS 3,406,244 A  10/1968  Oktay
3,512,582 A  5/1970  Chu et al.
(Continued)

FOREIGN PATENT DOCUMENTS

JP  4-116758 A  4/1992
JP  10-85683 A  4/1998
(Continued)

OTHER PUBLICATIONS

"The CRAY-2 Computer System", marketing brochure of Cray Research, Inc 1985.
(Continued)

*Primary Examiner* — Frantz F Jules
*Assistant Examiner* — Jason N Thompson
(74) *Attorney, Agent, or Firm* — K&L Gates LLP

(57) ABSTRACT

A appliance immersion tank system comprising: a generally rectangular tank adapted to immerse in a dielectric fluid a plurality of appliances, each in a respective appliance slot distributed vertically along, and extending transverse to, the long axis of the tank; a primary circulation facility adapted to circulate the dielectric fluid through the tank; a secondary fluid circulation facility adapted to extract heat from the dielectric fluid circulating in the primary circulation facility, and to dissipate to the environment the heat so extracted; and a control facility adapted to coordinate the operation of the primary and secondary fluid circulation facilities as a function of the temperature of the dielectric fluid in the tank. A plenum, positioned adjacent the bottom of the tank, is adapted to dispense the dielectric fluid substantially uniformly upwardly through each appliance slot. A weir, integrated horizontally into a long wall of the tank, is adapted to facilitate substantially uniform recovery of the dielectric fluid flowing through each appliance slot. All active and most passive components of both the primary and secondary
(Continued)

fluid circulation facilities, and the control facility are fully redundant, and are adapted automatically to operate in a fail-soft mode.

19 Claims, 7 Drawing Sheets

Related U.S. Application Data continuation of application No. 14/355,533, filed as application No. PCT/US2013/075126 on Dec. 13, 2013, now Pat. No. 10,405,457.

(60) Provisional application No. 61/832,211, filed on Jun. 7, 2013, provisional application No. 61/737,200, filed on Dec. 14, 2012.

(58) Field of Classification Search
USPC .................................................. 165/301
See application file for complete search history.

(56) References Cited

U.S. PATENT DOCUMENTS

| | | | |
|---|---|---|---|
| 4,072,188 A | 2/1978 | Wilson et al. | |
| 4,453,197 A | 6/1984 | Burrage | |
| 4,590,538 A * | 5/1986 | Cray, Jr. | H05K 7/20781 |
| | | | 361/700 |
| 4,870,243 A | 9/1989 | Wilson et al. | |
| 5,054,519 A | 10/1991 | Berman | |
| 5,167,511 A | 12/1992 | Krajewski et al. | |
| 5,297,621 A | 3/1994 | Taraci et al. | |
| 5,341,825 A | 8/1994 | Kobayashi | |
| 5,651,836 A | 7/1997 | Suzuki | |
| 6,001,189 A | 12/1999 | Rolfson | |
| 6,019,167 A | 2/2000 | Bishop et al. | |
| 6,060,966 A * | 5/2000 | Tennant | F28F 13/02 |
| | | | 165/80.4 |
| 6,535,382 B2 | 3/2003 | Bishop et al. | |
| 6,752,897 B2 | 6/2004 | Jang et al. | |
| 6,776,707 B2 | 8/2004 | Koplin | |
| 6,840,250 B2 | 1/2005 | Kashkoush et al. | |
| 6,872,262 B2 | 3/2005 | Chong et al. | |
| 7,200,007 B2 | 4/2007 | Yasui et al. | |
| 7,318,322 B2 | 1/2008 | Ota et al. | |
| 7,403,392 B2 | 7/2008 | Attlesey et al. | |
| 7,433,188 B2 | 10/2008 | Miller | |
| 7,532,699 B2 | 5/2009 | Meseth | |
| 7,724,524 B1 | 5/2010 | Campbell et al. | |
| 7,905,106 B2 | 3/2011 | Attlesey | |
| 8,009,419 B2 | 8/2011 | Attlesey et al. | |
| 8,014,150 B2 | 9/2011 | Campbell et al. | |
| 8,035,972 B2 | 10/2011 | Ostwald et al. | |
| 8,369,090 B2 | 2/2013 | Chester et al. | |
| 10,123,463 B2 | 11/2018 | Best et al. | |
| 2006/0090881 A1 | 5/2006 | Tuma | |
| 2006/0126292 A1* | 6/2006 | Pfahnl | H05K 7/20563 |
| | | | 361/695 |
| 2008/0013276 A1 | 1/2008 | Pyle | |
| 2008/0017355 A1 | 1/2008 | Attlesey et al. | |
| 2008/0192389 A1 | 8/2008 | Muench et al. | |
| 2011/0132579 A1* | 6/2011 | Best | H05K 7/20 |
| | | | 165/104.31 |
| 2011/0240281 A1 | 10/2011 | Avery | |
| 2014/0211412 A1 | 7/2014 | Best | |
| 2015/0020994 A1* | 1/2015 | Mori | F28D 15/00 |
| | | | 165/96 |
| 2019/0014685 A1* | 1/2019 | So | H05K 7/20272 |
| 2019/0364693 A1* | 11/2019 | Nishiyama | H05K 7/20272 |
| 2020/0037467 A1* | 1/2020 | Ishinabe | H05K 7/20236 |
| 2020/0253096 A1* | 8/2020 | Mcbain | H05K 9/009 |

FOREIGN PATENT DOCUMENTS

| | | | |
|---|---|---|---|
| JP | 10-135173 A | 5/1998 | |
| JP | 10-289894 A | 10/1998 | |
| JP | 2000-183024 A | 6/2000 | |
| JP | 2001-118820 A | 4/2001 | |
| JP | 2001-181898 A | 7/2001 | |
| JP | 2001-207296 A | 7/2001 | |
| JP | 2001-304937 A | 10/2001 | |
| JP | 2002-93769 A | 3/2002 | |
| JP | 2002-184747 A | 6/2002 | |
| JP | 2004211111 A | 7/2004 | |
| JP | 2006-13015 A | 1/2006 | |
| JP | 2007-152231 A | 6/2007 | |
| JP | 2007-201330 A | 8/2007 | |
| JP | 2007301529 A | 11/2007 | |
| JP | 2008-43938 A | 2/2008 | |
| JP | 2008-86900 A | 4/2008 | |
| JP | 2008-251779 A | 10/2008 | |
| JP | 2009-202156 A | 9/2009 | |
| JP | 2010-22885 A | 2/2010 | |
| JP | 2010-212363 A | 9/2010 | |
| JP | 2012-204546 A | 10/2012 | |
| RU | 2042294 C1 | 8/1995 | |
| RU | 2500013 C1 | 11/2013 | |
| SU | 1764094 A1 | 9/1992 | |
| WO | 2010058154 | 5/2010 | |
| WO | WO-2018207305 A1 * | 11/2018 | ............ G06F 1/20 |

OTHER PUBLICATIONS

Patel, Nilay, "Puget Custom Computer's mineral-oil-cooled PC", web-presentation posted May 12, 2007 at 11:57AM.
Green Revolution Cooling, CarnotJet, Article on Green Revolution Cooling Website, May 11, 2011.
Cray Research, Inc., The CRAY-2 Computer System, Article, 1985.
Rich Miller, Submerged Servers: Green Revolution Cooling, Mar. 17, 2010.
Robert E. Simons, Direct Liquid Immersion Cooling for High Power Density Microelectronics, May 1, 2006.
Phil Tuma, Open Bath Immersion Cooling in Data Centers: A New Twist on an Old Idea, Dec. 6, 2010.
Puget Systems, Mineral Oil Cooled PC, Nov. 24, 2011.
E.A. Wilson, True Liquid Cooling of Computers, 1977.
Green Revolution Cooling, The CarnotJet System: Cable Mangement, Apr. 13, 2011, https://www.youtube.com/watch?v=V-x4pER5YuU.
Boston Limited, Iceotope—The Next Generation in Liquid, May 11, 2011, https://www.youtube.com/watch?v=qjewBaWEwtg.
Puget Systems, Mineral Oil Submersion Cooling, May 5, 2007, https://ww.youtube.com/watch?v=PtufuXLvOok.
Immersion Systems LLC, Invalidity Claim Chart U.S. Pat. No. 10,405,457, Cause No. 4:20-cv-00555-O, *Midas Green Technologies, LLC v. Immersion Ssytems LLC*, Defendant Immersion System LLC's Preliminary Invalidity and Unenforceability Contentions, Exhibit A.
Immersion Systems LLC, Invalidity Claim Chart U.S. Pat. No. 10,405,457, Cause No. 4:20-cv-00555-O, *Midas Green Technologies, LLC v. Immersion Ssytems LLC*, Defendant Immersion System LLC's Preliminary Invalidity and Unenforceability Contentions, Exhibit B.
Immersion Systems LLC, Invalidity Claim Chart U.S. Pat. No. 10,405,457, Cause No. 4:20-cv-00555-O, *Midas Green Technologies, LLC v. Immersion Ssytems LLC*, Defendant Immersion System LLC's Preliminary Invalidity and Unenforceability Contentions, Exhibit C.
Immersion Systems LLC, Invalidity Claim Chart U.S. Pat. No. 10,405,457, Cause No. 4:20-cv-00555-O, *Midas Green Technologies, LLC v. Immersion Ssytems LLC*, Defendant Immersion System LLC's Preliminary Invalidity and Unenforceability Contentions, Exhibit D.
Immersion Systems LLC, Invalidity Claim Chart U.S. Pat. No. 10,405,457, Cause No. 4:20-cv-00555-O, *Midas Green Technolo-

(56) References Cited

OTHER PUBLICATIONS gies, LLC v. Immersion Ssytems LLC, Defendant Immersion System LLC's Preliminary Invalidity and Unenforceability Contentions, Exhibit E.
Immersion Systems LLC, Invalidity Claim Chart U.S. Pat. No. 10,405,457, Cause No. 4:20-cv-00555-O, Midas Green Technologies, LLC v. Immersion Ssytems LLC, Defendant Immersion System LLC's Preliminary Invalidity and Unenforceability Contentions, Exhibit F.
Immersion Systems LLC, Invalidity Claim Chart U.S. Pat. No. 10,405,446, Cause No. 4:20-cv-00555-O, Midas Green Technologies, LLC v. Immersion Ssytems LLC, Defendant Immersion System LLC's Preliminary Invalidity and Unenforceability Contentions, Exhibit G.
Immersion Systems LLC, Invalidity Claim Chart U.S. Pat. No. 10,405,446, Cause No. 4:20-cv-00555-O, Midas Green Technologies, LLC v. Immersion Ssytems LLC, Defendant Immersion System LLC's Preliminary Invalidity and Unenforceability Contentions, Exhibit H.
Immersion Systems LLC, Invalidity Claim Chart U.S. Pat. No. 10,405,446, Cause No. 4:20-cv-00555-O, Midas Green Technologies, LLC v. Immersion Ssytems LLC, Defendant Immersion System LLC's Preliminary Invalidity and Unenforceability Contentions, Exhibit I.
Immersion Systems LLC, Invalidity Claim Chart U.S. Pat. No. 10,405,446, Cause No. 4:20-cv-00555-O, Midas Green Technologies, LLC v. Immersion Ssytems LLC, Defendant Immersion System LLC's Preliminary Invalidity and Unenforceability Contentions, Exhibit J.
Cheng et al., Design of a single-phase immersion cooling system through experimental and numerical analysis, International Journal of Heat and Mass Transfer, 160, 2020, 12 pages.
Chu et al., Review of Cooling Technologies for Computer Products, IEEE Transactions On Device and Materials Reliability, vol. 4, No. 4, Dec. 2004, pp. 568-585.
Liu et al., Evaluation and Optimization of a Two-Phase Liquid-Immersion Cooling System for Data Centers, Energies 2021, 14, 1395, 21 pages.
Expert Declaration of Dr. Issam Mudawar from PGR2021-00104 (U.S. Pat. No. 10,820,446 B2), Jul. 26, 2021, 155 pages.
Matsuoka et al., Liquid immersion cooling technology with natural convection in data center, 2017 IEEE 6th international conference on Cloud networking (CloudNet), IEEE, 2017, 6 pages.
Expert Declaration of Dr. Issam Mudawar from IPR2021-01176 (U.S. Pat. No. 10,405,457 B2), Jun. 23, 2021, 155 pages.
Tuma, Phillip, The Merits of Open Bath Immersion Cooling of Datacom Equipment, 26th IEEE Semi-Therm Symposium, 2010, 9 pages.
Miller, R., "Colocation Company Will Submerge Servers," Aug. 25, 2010, available at https://www.datacenterknowledge.com/archives/2010/08/25/colocation-company-will-submerge-servers.
McMillan, R., "Servers Too Hot? Intel Recommends a Luxurious Oil Bath," Aug. 31, 2012, available at https://www.wired.com/2012/08/servers-too-hot-intel-recommends-a-luxurious-oil-bath/.
Cohen, N., "Intel does math on oil-dunk test for cooler servers," Sep. 3, 2012, available at https://phys.org/news/2012-09-intel-math-oil-dunk-cooler-servers.html.
Witkin, J., "Cooling a Computer Server With Mineral Oil," Sep. 6, 2012, available at https://archive.nytimes.com/green.blogs.nytimes.com/2012/09/06/cooling-a-computer-server- with-mineral-oil/.
Presentation Slides, titled "Data Center Immersion Cooling" by Chris Boyd of Midas Green Technologies, LLC, dated Nov. 2011, slides available at https://www.slideserve.com/gita/data-center-immersion-cooling#google_vignette.
"Cable Management Features of GRC's Rack-Based Immersion-Cooling Systems," video posted Apr. 13, 2011, available at https://www.youtube.com/watch?v=V-x4pER5YuU.
GRC "CarnotJet" Product webpage, Feb. 1, 2011, available at https://web.archive.org/web/20110201123329/ http://www.grcooling.com/?page_id=6.
GRC "Gallery" webpage, Mar. 23, 2011, available at https://web.archive.org/web/20110323150152/http://www.grcooling.com:80/?page_id=655.
DataCenterKnowledge webpage, "Submerged Servers Can Now Heat Your Office," Feb. 6, 2012, available at https://web.archive.org/web/20120206000918/http://www.datacenterknowledge.com/archives/ 2011/11/14/submerged-servers-can-now-heat-your-office/.
GRC "Design" webpage, Feb. 21, 2012, available at https://web.archive.org/web/20120221214135/http://www.grcooling.com:80/product/design/.
"A Top-20 Supercomputing Facility Rethinks its Cooling Efficiency with Fluid-Submersion Cooling," Nov. 14, 2012, available at https://web.archive.org/web/20121114152326/http://www.grcooling.com/docs/Green-Revolution-Cooling-and-Texas-Advanced-Computing-Center-Research-Poster.pdf.
"See Our ICEraQ™ Micro-Modular, Rack-Based Immersion-Cooling System in Action," video posed Apr. 17, 2012, available at https://www.youtube.com/watch?v=6IX9U2zal_I.
Green Revolution Cooling, INC.'s Disclosure of Prior Art and Preliminary Invalidity Contentions, in the United States District Court for the Western District of Texas Waco Division, Civil Action No. 6:24-CV-166-ADA, Oct. 7, 2024, Midas Green Tech., EX-2006, IPR2025-00196, 130 pages.
Defendant Immersion Systems LLC's Preliminary Invalidity and Unenforceability Contentionsin the United States District Court Northern District of Texas Fort Worth Division, Case No. 4:20-cv-00555-O, Jan. 11, 2021, Midas Green Tech.—Ex. 2002 PGR2021-00104 (U.S. Pat. No. 10,820,446), 55 pages.
Defendant Immersion Systems LLC's Supplemental Preliminary Invalidity and Unenforceability Contentions, in the United States District Court for the Northern District of Texas Fort Worth Division, Case No. 4:20-cv-00555-O,Aug. 9, 2021, Midas Green Tech.—Ex. 2005, PGR2021-00104 (U.S. Pat. No. 10,820,446), 94 pages.
Decision Denying Institution of Inter Partes Review, United States Patent and Trademark Office, Before the Patent Trial and Appeal Board, Immersion Systems LLC, Petitioner v. Midas Green Technologies, LLC, Patent Owner. IPR2021-01176, U.S. Pat. No. 10,405,457 B2, 21 pages. Jan. 6, 2022.
Petition for Inter Partes Review, United States Patent and Trademark Office Before the Patent Trial and Appeal Board, Immersion Systems LLC, Petitioner v. Midas Green Technologies, LLC, Patent Owner. Case No. IPR2021-01176, U.S. Pat. No. 10,405,457, 80 pages. Jun. 23, 2021.
Petition for Inter Partes Review of Claims 1-16 Of U.S. Pat. No. 10,405,457, United States. Patent and Trademark Office Before the Patent Trial and Appeal Board, Green Revolution Cooling, Inc., Petitioner v. Midas Green Technologies, LLC, Patent Owner. U.S. Pat. No. 10,405,457 to Boyd, et al. IPR Case No. IPR2025-00196, Nov. 19, 2024, 88 pages.
Declaration of Werner J.A. Dahm, Ph.D. In Support of Petition for Inter Parts Review, United States Patent and Trademark Office Before the Patent Trial and Appeal Board, Green Revolution Cooling, Inc., Petitioner v. Midas Green Technologies, LLC, Patent Owner. U.S. Pat. No. 10,405,457 to Boyd, et al. IPR Case No. IPR2025-00196, Nov. 19, 2024, Petitioner Green Revolution Cooling, Inc., Ex-1003 IPR2025-00196, 122 pages.
Decision Granting Institution of Inter Partes Review, United States Patent and Trademark Office Before the Patent Trial and Appeal Board, Green Revolution Cooling, Inc., Petitioner v. Midas Green Technologies, LLC, Patent Owner. IPR2025-00196, U.S. Pat. No. 10,405,457 B2, May 23, 2025, 48 pages.
Decision Denying Institution of Post-Grant Review, United States Patent and Trademark Office Before the Patent Trial and Appeal Board, Immersion Systems LLC, Petitioner v. Midas Green Technologies, LLC, Patent Owner. Case No. PGR2021-00104, U.S. Pat. No. 10,820,446 B2, Jan. 31, 2022, 18 pages.
Petition for Post Grant Review, United States Patent and Trademark Office Before the Patent Trial and Appeal Board, Immersion Systems LLC, Petitioner v. Midas Green Technologies, LLC, Patent Owner. Case No. PGR2021-00104, U.S. Pat. No. 10,820,446 B2, Jul. 28, 2021, 83 pages.

\* cited by examiner

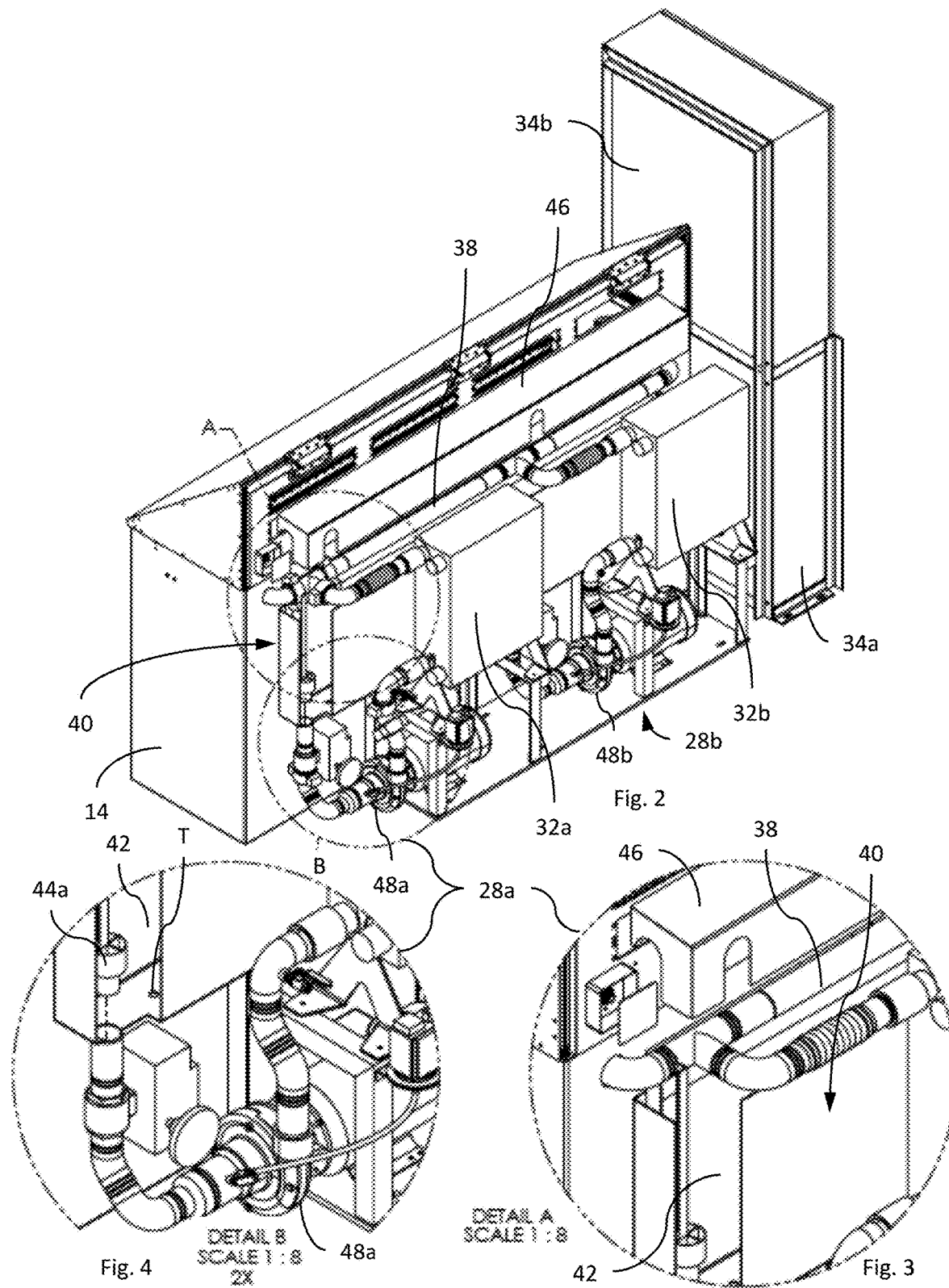

Section C-C

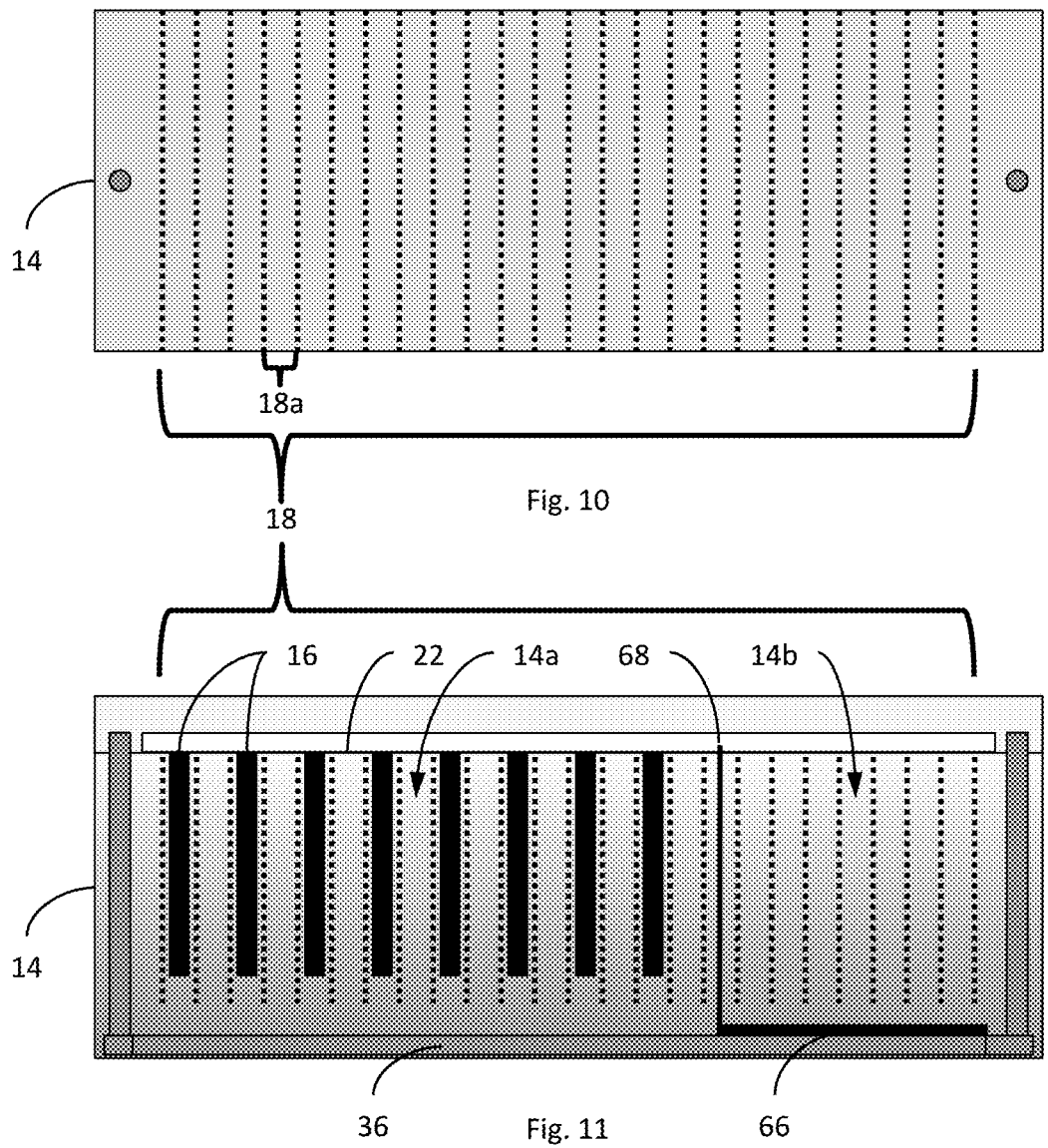

APPLIANCE IMMERSION COOLING SYSTEM

CROSS-REFERENCE TO RELATED APPLICATIONS

This application is related to the following Provisional Applications:
1. Ser. No. 61/737,200, filed 14 Dec. 2012 ("First Parent Provisional"); and
2. Ser. No. 61/832,211, filed 7 Jun. 2013 ("Second Parent Provisional"); and hereby claims benefit of the filing dates thereof pursuant to 37 CFR § 1.78(a)(4). (Collectively, "Parent Provisionals"). The subject matter of the Parent Provisionals, each in its entirety, is expressly incorporated herein by reference.

CROSS-REFERENCE TO RELATED APPLICATIONS

This application is:
a continuation of U.S. application Ser. No. 16/243,732, filed 9 Jan. 2019 ("First Parent Application"), now U.S. Pat. No. 10,820,446, issued 27 Oct. 2020;
which was a continuation of application Ser. No. 14/355,533, filed 30 Apr. 2014 ("Second Parent Application"), now U.S. Pat. No. 10,405,457, issued 3 Sep. 2019;
which was a National Stage Entry of PCT/US2013/75126, filed 13 Dec. 2013 ("PCT Application");
which claimed the Priority of both:
U.S. Provisional Application Ser. No. 61/832,211, filed 7 Jun. 2013 ("First Parent Provisional"); and
U.S. Provisional Application Ser. No. 61/737,200, filed 14 Dec. 2012 ("Second Parent Provisional").
This application claims priority to:
the First Parent Provisional;
the Second Parent Provisional;
the PCT Application;
the First Parent Application; and
the Second Parent Application;
and hereby claims benefit of the filing dates thereof pursuant to 37 CFR § 1.78(a)(4).

BACKGROUND OF THE INVENTION

1. Field of the Invention

The present invention relates generally to electrical appliance cooling systems, and, in particular, to an improved appliance immersion cooling system and method of operation.

2. Description of the Related Art

In general, in the descriptions that follow, we will italicize the first occurrence of each special term of art which should be familiar to those skilled in the art of immersion cooling systems. In addition, when we first introduce a term that we believe to be new or that we will use in a context that we believe to be new, we will bold the term and provide the definition that we intend to apply to that term.

U.S. Pat. No. 4,590,538, "Immersion Cooled High Density Electronic Assembly", Cray (filed 18 Nov. 1981 and issued 20 May 1986) ("Cray"), is an early example of an immersion system for cooling electronic components during normal operation. On information and belief, the machine disclosed therein was the Cray-2 super-computer ("Cray-2") manufactured by Cray Research, Inc. ("Cray Research"), of Chippewa Falls, Wisconsin. Of particular interest to the present application is the description of the significant advantages resulting from using an electrically non-conductive or dielectric fluid to extract heat from electronic circuit assemblies during normal operation (see, e.g., col. 1, line 66-col. 2, line 29).

On information and belief, Cray Research released, in 1985, a marketing brochure entitled "The CRAY-2 Computer System" (a copy of which is submitted herewith) describing the Cray-2. Of particular interest in this brochure is the description therein of the significant advantages resulting from using a dielectric fluid to extract heat from electronic circuit assemblies during normal operation (see, pages 10 and 13).

U.S. Pat. No. 5,167,511, "High Density Interconnect Apparatus", Krajewski, et al. (issued 27 Nov. 1992) ("Krajewski"), discloses another example of an immersion system for cooling electronic components during normal operation (see, e.g., col. 2, lines 43-51). On information and belief, a machine implementing the Krajewski system was also marketed by Cray Research as a follow-on super-computer to the Cray-2.

One particular problem in the vertical-stack-type systems disclosed in the above references is the necessity of draining the cooling fluid whenever physical access to the electronic modules was required. In general, such an operation, besides being time consuming, requires the entire system to be switched off, especially if the component requiring attention is an essential element in the system architecture, such as the central processing unit ("CPU"). One possible solution to this problem is to immerse circuit assemblies vertically into a tank containing the cooling fluid such that each of the various assemblies can be withdrawn independently from the tank for servicing, replacement, upgrade, etc. One interesting example of such a system is disclosed in a web-presentation entitled "Puget Custom Computer's mineral-oil-cooled PC", by Nilay Patel ("Puget") (posted 12 May 2007 at 11:57 AM; a copy of which is submitted herewith). As noted by the author, the lack of supplemental apparatus in the Puget system to extract waste heat from the oil inherently limited its operating capabilities.

Another problem with the Cray Research systems in particular is the nature and cost of the chosen cooling fluid: fluorocarbon liquids. As is known, other dielectric fluids, such as mineral oil, have better heat transfer characteristics; of course, being an oil, the use thereof does represent a greater residue problem on modules that may be repairable. Notwithstanding, the Puget system implemented precisely this design choice.

US Patent Application Publication 2011/0132579, "Liquid Submerged, Horizontal Computer Appliance Rack and Systems and Method of Cooling such a Appliance Rack", Best, et al. ("Best"), discloses a appliance immersion tank system, include support apparatus for extracting waste heat from the tank cooling fluid and dissipating to the environment the heat so extracted. Although an improvement in several respects over the prior art discussed above, this system exhibits, inter alia, the following problems: generally non-uniform flow patterns through the several appliance slots within the tank, potentially resulting in uneven cooling across all slots; constricted dielectric fluid supply and return ports resulting in unnecessarily high fluid flow velocities at the respective points of connection to the tank; poor scalability; and inadequate attention to fail-soft operation.

The subject matter of all of the prior art references discussed above, each in its entirety, is expressly incorporated herein by reference.

We submit that what is needed is an improved appliance tank immersion system and method of operation. In particular, we submit that such a system should provide performance generally comparable to the best prior art techniques but more efficiently and effectively than known implementations of such prior art techniques.

BRIEF SUMMARY OF THE INVENTION

In accordance with one embodiment of our invention, we provide an appliance immersion cooling system comprising: a tank adapted to immerse in a dielectric fluid a plurality of electrical appliances, each in a respective appliance slot distributed vertically along, and extending transverse to, a selected wall of the tank; a primary circulation facility adapted to circulate the dielectric fluid through the tank, comprising: a plenum, positioned adjacent the bottom of the tank, adapted to dispense the dielectric fluid substantially uniformly upwardly through each appliance slot; a secondary fluid circulation facility adapted to extract heat from the dielectric fluid circulating in the primary circulation facility, and to dissipate to the environment the heat so extracted; and a control facility adapted to coordinate the operation of the primary and secondary fluid circulation facilities as a function of the temperature of the dielectric fluid in the tank.

In accordance with one other embodiment of our invention, we provide a tank module adapted for use in an appliance immersion cooling system, the tank module comprising: a tank adapted to immerse in a dielectric fluid a plurality of electrical appliances, each in a respective appliance slot distributed vertically along, and extending transverse to, a selected wall of the tank; a primary circulation facility adapted to circulate the dielectric fluid through the tank, comprising: a plenum, positioned adjacent the bottom of the tank, adapted to dispense the dielectric fluid substantially uniformly upwardly through each appliance slot; and a control facility adapted to control the operation of the primary fluid circulation facility as a function of the temperature of the dielectric fluid in the tank.

In accordance with yet another embodiment of our invention, we provide an appliance immersion cooling system comprising: a tank adapted to immerse in a dielectric fluid a plurality of electrical appliances, each in a respective appliance slot distributed vertically along, and extending transverse to, a selected wall of the tank; a primary circulation facility adapted to circulate the dielectric fluid through the tank, comprising: a plenum, positioned adjacent the bottom of the tank, adapted to dispense the dielectric fluid substantially uniformly upwardly through each appliance slot; a secondary fluid circulation facility adapted to extract heat from the dielectric fluid circulating in the primary circulation facility, and to dissipate to the environment the heat so extracted; and a control facility adapted to coordinate the operation of the primary and secondary fluid circulation facilities as a function of the temperature of the dielectric fluid in the tank.

In accordance with still another embodiment of our invention, we provide a tank adapted to immerse in a dielectric fluid a plurality of electrical appliances, each in a respective appliance slot distributed vertically along, and extending transverse to, a selected wall of the tank, the tank comprising a selected one or both of: a plenum, positioned adjacent the bottom of the tank, adapted to dispense dielectric fluid substantially uniformly upwardly through each appliance slot; and a weir, integrated horizontally into the selected wall of the tank adjacent all appliance slots, having an overflow lip adapted to facilitate substantially uniform recovery of dielectric fluid dispensed upwardly through each appliance slot.

BRIEF DESCRIPTION OF THE SEVERAL VIEWS OF THE DRAWINGS

Our invention may be more fully understood by a description of certain preferred embodiments in conjunction with the attached drawings in which:

FIG. 2 illustrates a rear perspective of the tank module shown in FIG. 1;

FIG. 3 illustrates a close-up perspective of a detail A of FIG. 2;

FIG. 4 illustrates a close-up perspective of a detail B of FIG. 2;

FIG. 10 illustrates, in top plan view, a plurality of appliance slots distributed vertically along, and extending transverse to, a long axis of the tank of FIG. 1;

FIG. 11 illustrates, in longitudinal cross-sectional view, the plurality of appliance slots distributed vertically along, and extending transverse to, the long axis of the tank of FIG. 1;

Figure 1:
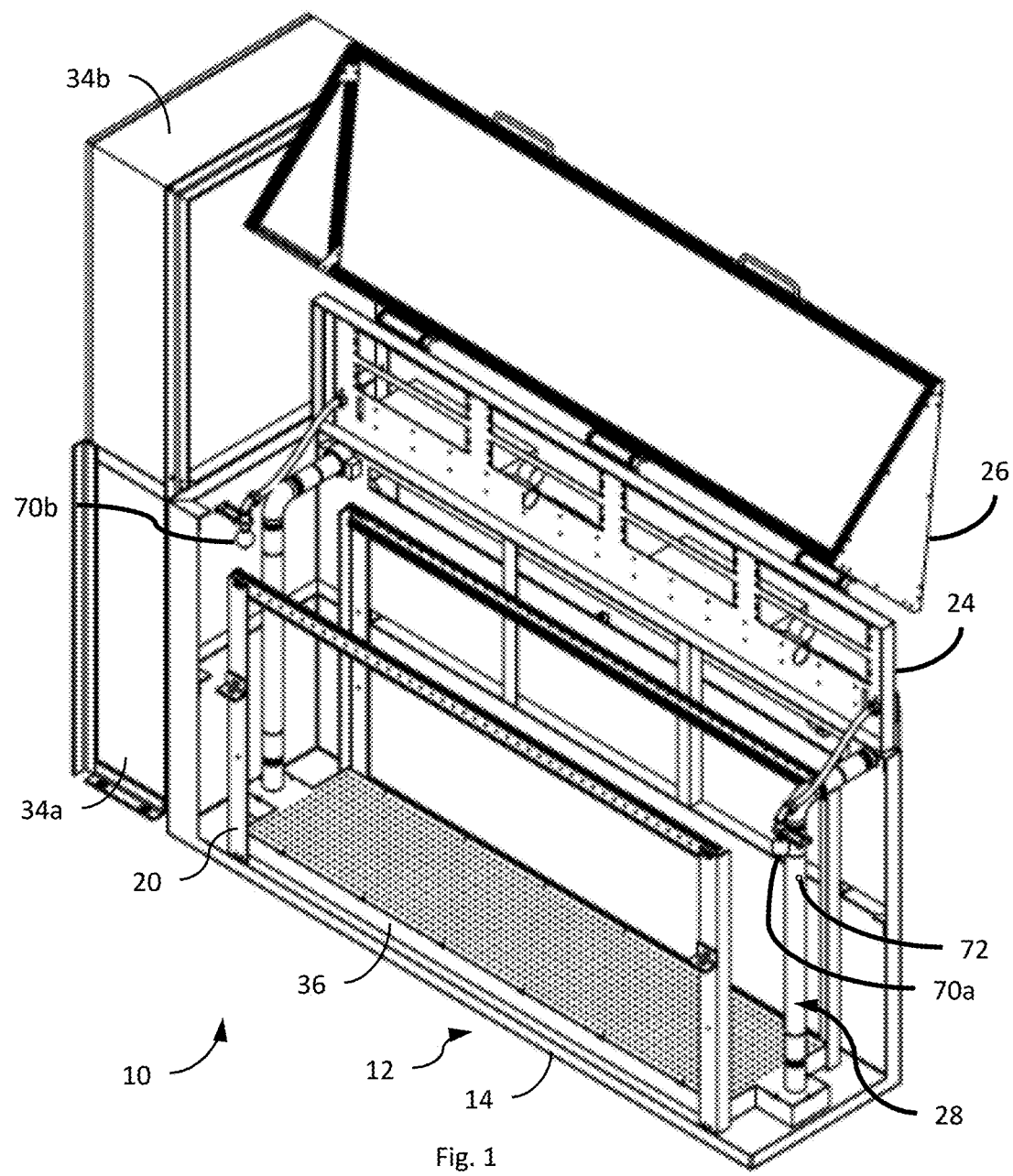
FIG. 1 illustrates, in partial cut-away form, a front perspective of a tank module of an appliance immersion cooling system constructed in accordance with our invention.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Figure 5:
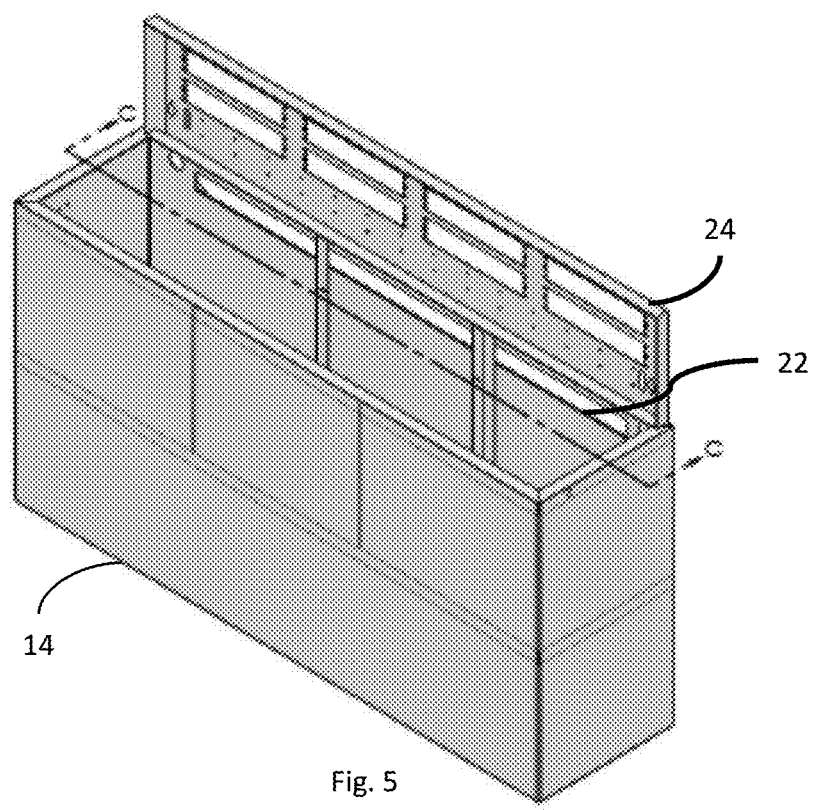
FIG. 5 illustrates, in perspective view, several details of the tank shown in FIG. 1, with special emphasis on the dielectric fluid recovery weir integrated into the long rear wall of the tank.
Figure 6:
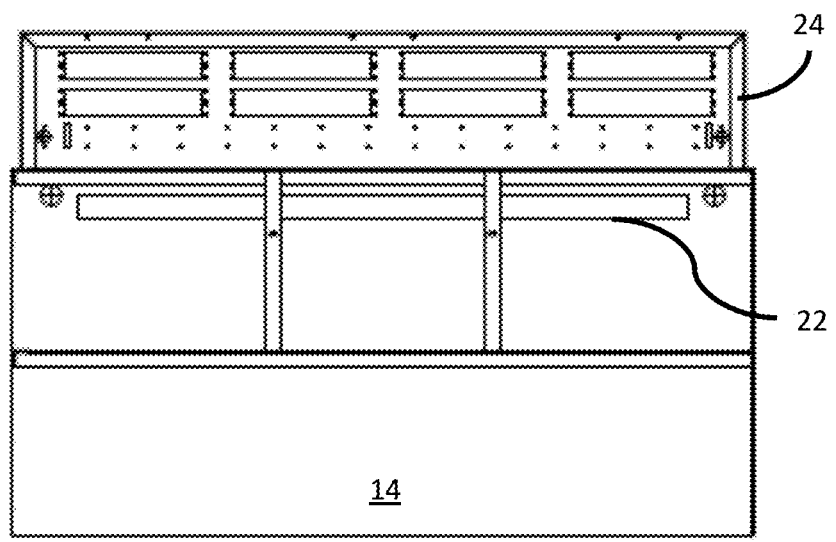
FIG. 6 illustrates, in cross-section view, the section C-C in FIG. 5.

Shown in FIG. 1 (front view) and FIG. 2 (rear view) is a tank module 10 adapted for use in an appliance immersion cooling system constructed in accordance with a preferred embodiment of our invention. For convenience of reference, we have illustrated in FIG. 1 the tank facility 12 of the immersion module 10 in partial cut-away to emphasize several important internal facilities; we have shown the tank facility 12 in isolation in FIG. 5. In general, the tank facility 12 comprises: a tank 14 adapted to immerse in a dielectric fluid a plurality of electrical appliances 16, e.g., contemporary computer servers (see, e.g., FIG. 11), each in a respective appliance slot 18*a* distributed vertically along, and extending transverse to, a long axis of the tank 14 (see, generally, FIG. 10); an appliance rack facility 20 of convention design adapted to suspend the appliances 16 (see, e.g., FIG. 11) in respective appliance slots 18 (see, FIG. 10); a weir 22 (best seen in isolation in FIG. 5 and FIG. 6), integrated horizontally into one long wall of the tank 14 adjacent all appliance slots 18, and adapted to facilitate substantially uniform recovery of the dielectric fluid flowing through each of the appliance slots 18; an interconnect panel facility 24 attached to the upper rear edge of the tank 14 and adapted to mount various appliance power distribution equipment, cable interconnection panels and the like (none shown); and a cover 26 adapted to be opened and closed from the front of the tank 14 (and which may include a translucent portion to allow viewing of the interior of the tank 14 when in the closed position). In addition to the tank facility 12, the immersion module 10 comprises: a primary circulation facility 28 (portions of which are shown in both FIG. 1 and FIG. 2); a secondary fluid circulation facility 30 (of which only redundant heat exchangers 32*a* and 32*b* are shown in FIG. 2); and control equipment cabinets 34*a* and 34*b*, each adapted to accommodate the module status and control equipment associated with a respective one of the primary circulation facilities 28*a* and 28*b* (see, FIG. 13).

Figure 7:
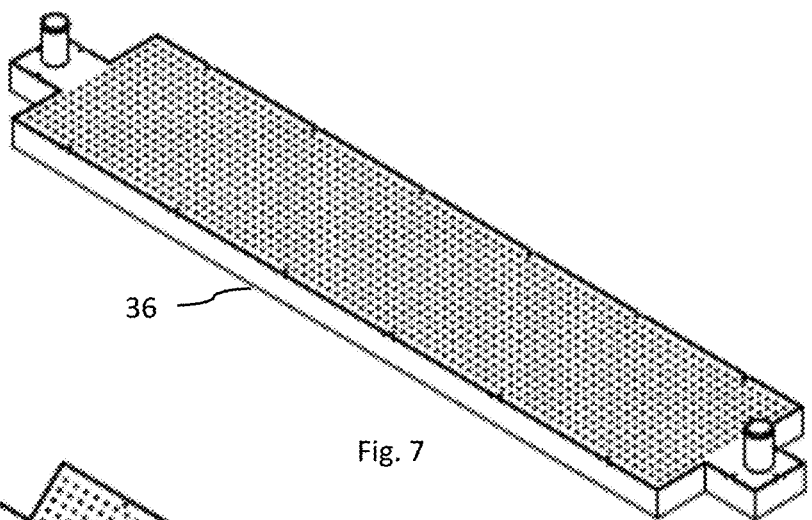
FIG. 7 illustrates, in perspective view, the plenum facility shown in FIG. 1.
Figure 8:
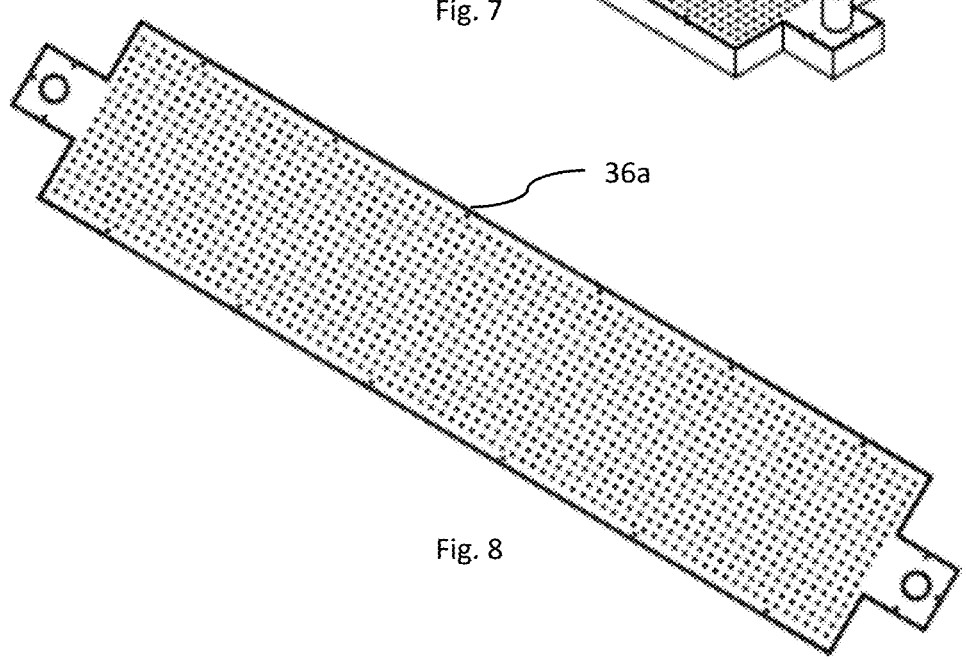
FIG. 8 illustrates, in top plan view, the orifice plate portion of the plenum facility shown in FIG. 7.
Figure 9:
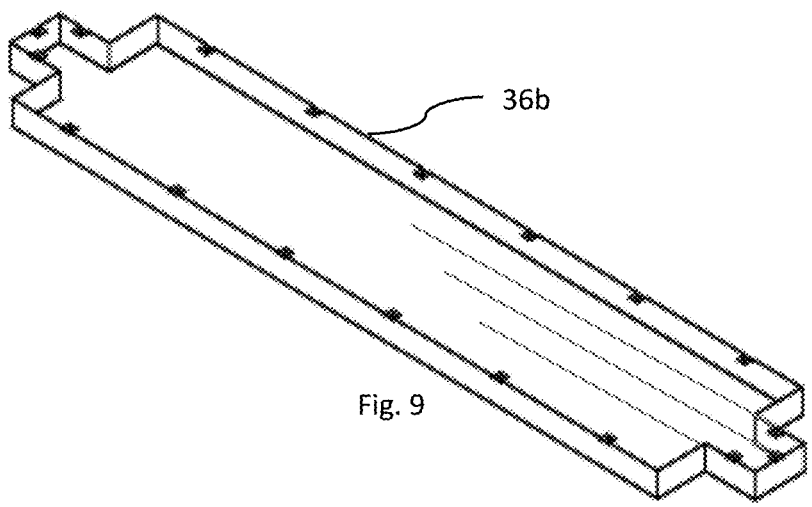
FIG. 9 illustrates, in perspective view, the chamber portion of the plenum facility shown in FIG. 7.

As can be best seen in FIG. 2, the primary circulation facility 28 (comprising redundant sub-facilities 28*a* and 28*b*) comprises both passive (conduits, couplers, etc.) and active (valves, pumps, sensors, etc.) components; a subset of the passive components are shared, whereas, in general, the active components are duplicated and adapted to cooperate in operation as separate, redundant sub-facilities. Excluding the tank 14, the primary shared component is the plenum facility 36 (see, FIG. 1 and FIG. 7) comprising an orifice plate 36*a* (see, FIG. 8) and a plenum chamber 36*b* (see, FIG. 9). As can be seen in FIG. 1, cooled dielectric fluid is pumped into both ends of the plenum facility 36 via a shared distribution header 38 (see, FIG. 2 and FIG. 3). In general, the plenum plate 36*a* comprises at least one row of orifices vertically aligned with each appliance slot 18*a*, with the dimensions and flow rates of each set being adapted to provide substantially equal flow of the dielectric fluid upwardly into each appliance slot 18*a*. Preferably, each appliance slot 18*a* is supplied via several rows of orifices, thus generally tending to reduce the volume of the dielectric fluid exiting each orifice and to make the flow of dielectric fluid more uniform upwardly through the appliance slots 18. One further shared component is the dielectric fluid recovery facility 40 (FIG. 2) comprising a dielectric fluid recovery reservoir 42 (see, FIG. 3, FIG. 4 and FIG. 13) positioned vertically beneath the overflow lip of the weir 22 and adapted smoothly to receive the dielectric fluid as it flows over the weir 22; the dielectric fluid recovery reservoir 42 is further adapted to allow the recovered fluid to be removed from the reservoir 42 via redundant recovery ports 44*a* and 44*b* (only port 44*a* can be seen in FIG. 2 as the port 44*b* is obscured by the heat exchanger 32*a*; but see FIG. 12). As can be seen in both FIG. 3 and FIG. 4, we consider it desirable to provide a vortex breaker at the input of each of the recovery ports 44. Also, we provide a removable recovery reservoir cover 46 adapted to also cover a major portion of the distribution header 38; note that, in both FIG. 2 and FIG. 3, we have illustrated the reservoir cover 46 in a partially raised orientation so as to better depict details that would otherwise be obscured. Note that we have constructed the reservoir 42 such that the average height of dielectric fluid above the recovery ports 44 develops sufficient hydrostatic head to meet the requirements of the pumps 48, while also tending to minimize the likelihood of breaking suction during normal operation.

At this point in the primary circulation facility 28, we provide fully redundant sub-facilities 28*a* and 28*b*, each comprising a primary circulation pump (48*a* and 48*b*) and associated passive and active components which, collectively, provide the motive power for circulating the dielectric fluid through the shared components and tank 14. As can be generally seen, each of these sub-facilities 28*a* and 28*b* is adapted to recover the dielectric fluid exiting the tank 14 via the weir 22, re-pressurize the recovered fluid, pass the re-pressurized fluid through a respective one of the heat exchangers 32*a* and 32*b*, and then back to the plenum facility 36 via the header 38.

Figure 12:
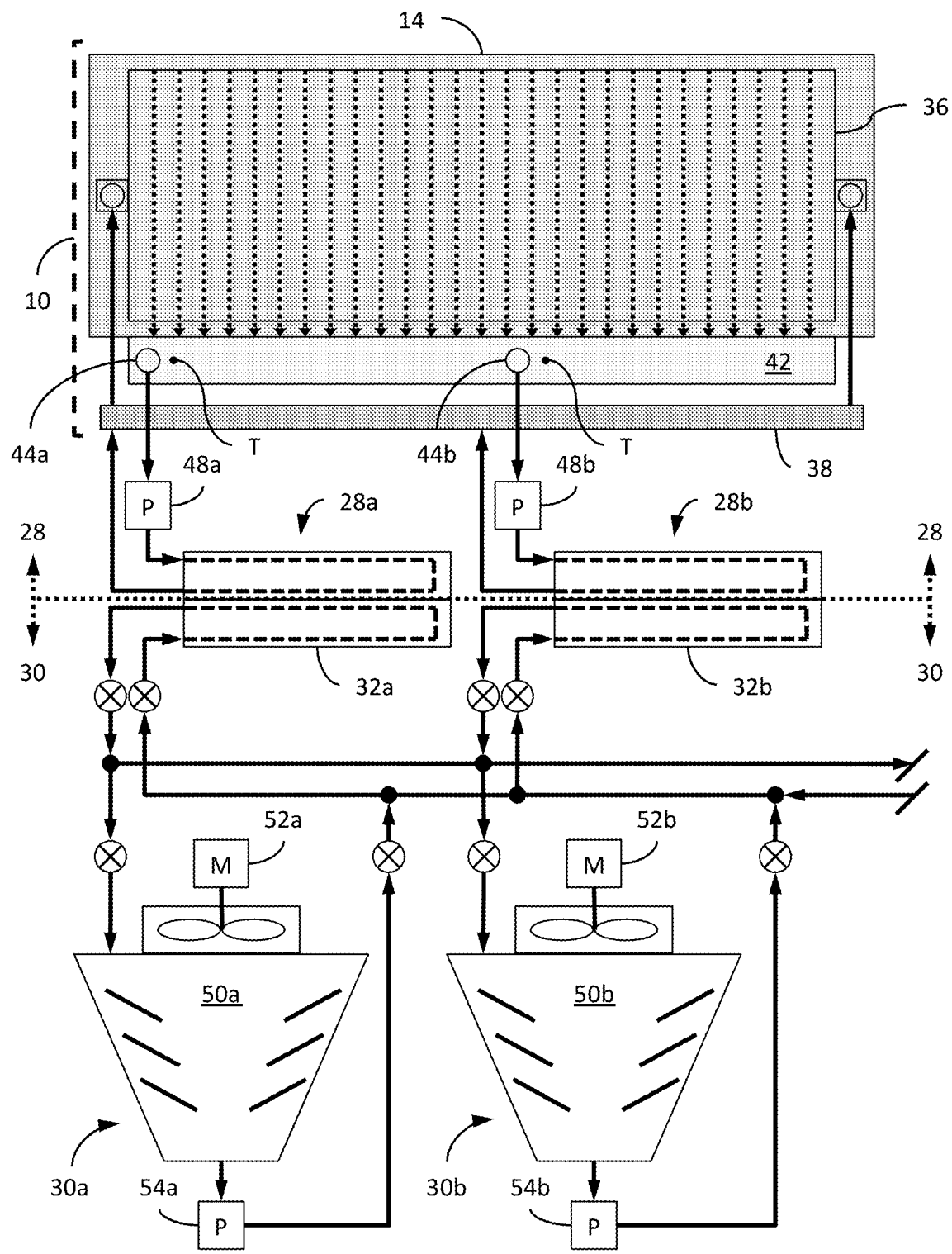
FIG. 12 illustrates, in flow schematic form, one instantiation of a flow arrangement suitable for implementing our invention.

Shown in FIG. 12 is one flow arrangement suitable for integrating our tank module 10 into a fully redundant, appliance immersion cooling system, comprising the primary circulation facility 28 and the secondary fluid circulation facility 30. In general, the secondary fluid circulation facility 30 comprises redundant secondary circulation sub-facilities 30*a* and 30*b*, each of which is adapted to circulate a cooling fluid, e.g., treated water, through the respective heat exchanger 32*a* and 32*b* to extract heat from dielectric fluid counter-circulating therethrough and to dissipate to the environment the heat so extracted. In the illustrated embodiment, each of the secondary fluid sub-facilities 30*a* and 30*b* comprise conventional cooling towers 50*a* (including fan facility 52*a*) and 50*b* (including fan facility 52*b*), and secondary circulation pumps 54*a* and 54*b*. To facilitate flexible operation in installations including multiple immersion modules 10 in combination with a plurality of secondary circulation sub-facilities 30, a common header arrangement can be implemented as illustrated in the secondary fluid circulation loop, with flow control valves located at key flow control points as is known.

Figure 13:
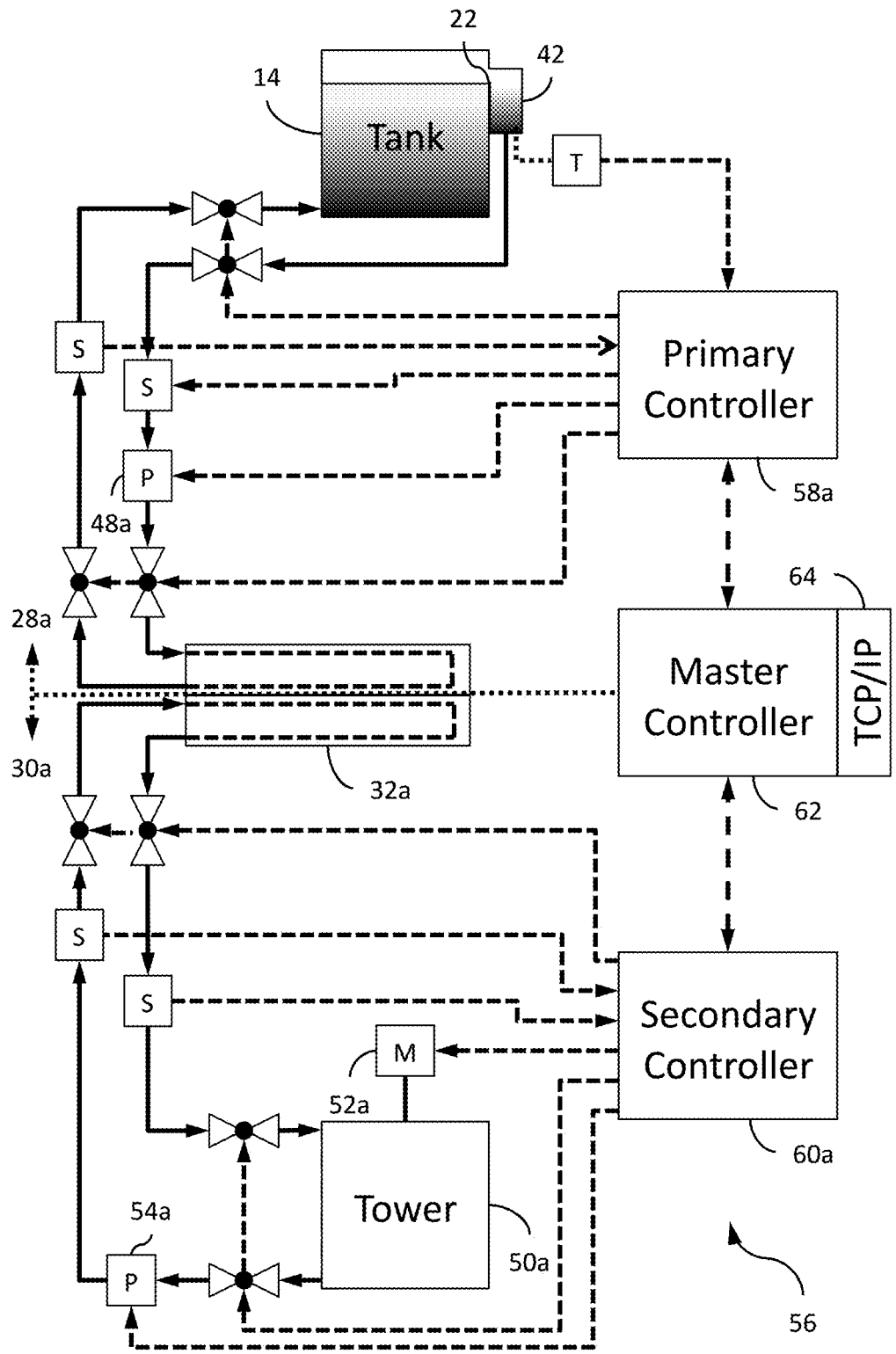
FIG. 13 illustrates, in control schematic form, one instantiation of a flow control facility suitable for implementing our invention.

Shown in FIG. 13 is a control facility 56 adapted to monitor and control the operation of both the immersion module 10 (including all active components of the primary circulation facility 28), and the secondary fluid circulation facility 30. As will be evident to those skilled in this art, efficient operation of our immersion module 10 requires continuous monitoring and control of several essential operating parameters, including fluidic temperatures, pressures, conductivity and pH at several points in the primary and secondary circulation loops. Although the several sensory and control functions can be implemented using traditional dedicated hardware components, we prefer to employ at least one programmable logic controller ("PLC"), commercially available from any of a number of respected vendors, e.g., the Allen-Bradley brand of PLCs from Rockwell Automation, Inc. In the instantiation illustrated in FIG. 13, we have depicted: a primary controller 58*a* adapted to monitor and control the operation of the primary circulation sub-facility 28*a* as a function of the temperature of the dielectric fluid in the tank 14; a secondary controller 60*a* adapted to monitor and control the operation of the secondary fluid circulation sub-facility 30*a* as a function of the temperature of the dielectric fluid flowing through the heat exchanger 32*a*; and a master controller 62 adapted to coordinate the activities of the primary controller 58*a* and secondary controller 60*a*. As can be seen, we have incorporated into the primary circulation sub-facility 28*a*: supply and return sensors, including a temperature probe, T, inserted into a thermowell (not shown) installed in the bottom of the reservoir 42 adjacent a respective return port 44*a* (note that, in FIG. 4, only one of the holes that receive the thermowells is illustrated, but both holes are illustrated in FIG. 12); a pair of sensor facilities, S, which may sense temperature, pressure and conductivity, as deemed desirable); and return (and, if desired, supply) flow control valves and controls for the primary circulation pump 48a; of course, a redundant set of these components exists for the primary circulation sub-facility 28b. In general, the goal is to maintain the temperature of the dielectric fluid in the tank 14 between a predetermined minimum temperature and a predetermined maximum temperature.

As noted above, we have provided separate control equipment cabinets 34a and 34b, each adapted to accommodate the several components comprising a respective one of the primary controllers 58a and 58b. For convenience of access, we prefer to co-locate with each of the cooling towers 50 a protective housing (not shown) for the respective secondary controller 60. Of course, the control facility 56 can be instantiated as a single, multi-module PLC facility, with similar or other combinations of monitoring devices as deemed most appropriate for a particular installation. Alternatively, one or more, and perhaps all, of the functions performed by the controllers 58, 60 and 62 may be implemented in the form of dedicated application-specific software executing on a conventional computer platform having the appropriate resources; indeed, it would be entirely feasible to implement the entire control facility 56 on a server 16 installed in a tank 14.

One desirable enhancement that we recommend is a remote control facility, implemented, e.g., via the master controller 62 (or by way of a direct, per-controller interface), adapted to facilitate remote monitoring of system status (e.g., temperatures, pressures, etc.) and control over system control parameters (e.g., temperature and pressure limits, etc.) to the primary controllers 58 and secondary controllers 60. For example, using a conventional data communication hardware module 64, e.g., an ethernet card implementing the TCP/IP protocol, a modern web browser can be adapted to provide a graphical user interface ("GUI") with sufficient functionality to facilitate monitoring and control of an entire installation from a remote location. Such a GUI may be implemented using any of a number of programming paradigms, e.g., PHP, .NET and the like.

Operational control of redundant, continuous process flow systems is generally well known. Preferable, each of the several redundant sub-facilities are routinely activated to assure current functionality, and to allow the inactive sub-facility to be serviced according to an established schedule. We believe this continuous rotation of system resources to be so important that we recommend switching the sub-facilities at least once, and preferably, several times, per day; although this is possible to implement manually, we prefer to enable the master controller 62 to control the sequencing of the several switch-over operations. One further aspect of this sophistication in control is the ability to perform stress testing of the several sub-systems under controlled conditions so as to assure appropriate response to real-time emergencies.

In our First Parent Provisional, we have disclosed an alternate embodiment comprising an appliance immersion tank facility wherein the function of the plenum facility 36 is performed by a manifold facility comprising a ladder-arrangement of tubular spray bars, each bar of which supplies dielectric fluid to a respective appliance slot. As we noted, one particular advantage of this arrangement is that individual spray bars may be shut off if the respective appliance slot is not occupied and, thus, save energy. To further increase energy efficiency, we have provided optional vertical flow barriers adapted to partition the tank into an active portion, having active appliances, and a stagnant portion, having no active appliances. One further enhancement we disclosed is the provision of temperature sensors per appliance slot, such that the flow rate through each spray bar can be dynamically varied as a function of the temperature of the dielectric fluid exiting the respective slot. Other operative configurations will be readily perceived by those skilled in this art.

In a manner analogous to the embodiment described in our First Parent Provisional, it would be advantageous, from an energy point of view, to provide a plurality of flow barrier plates 66 (shown by way of example only in FIG. 11), each adapted to be attached to the top of the plenum facility 36 so as substantially to block the flow of the dielectric fluid through the row(s) of orifices in the plenum plate 36a corresponding to at least a respective one of the appliance slots 18a; an elastomeric layer (not shown) could be provided on the interface surface of the plate(s) 66 to enhance the sealing effect. Such an arrangement would allow the total flow through the plenum facility 36 to be adjusted, in the field, as a function of the actual number of active appliances 16 in the tank 14. Further, this arrangement can incorporate a relocatable vertical baffle plate 68 (see FIG. 11) adapted substantially to partition the tank 14 into an active portion 14a containing the active appliances 16 and an inactive portion 14b containing no appliances (or at least no active appliances 16); preferably, the baffle plate 68 is adapted to be mounted in the appliance rack facility 28 in a manner similar to an actual appliance 16 (the baffle plate 68 need not fully block the flow of dielectric fluid between the active portion 14a and inactive portion 14b, but only significantly impede the flow between these portions). Note that, in the example scenario illustrated in FIG. 11, we have shown one possible arrangement of a total of 8 active appliances 16 distributed across 16 appliance slots 18a so as to spread the total heat load across adjacent empty slots 18a. Such an optimal arrangement is possible only if less than a majority of the available appliance slots 18a are occupied by an active appliance 16. Clearly, such optional adjunct facilities enhance flexibility in operation, accommodating dynamic adjustment of the flow rates in the primary circulation sub-facilities 28a and 28b under variable heat loads, while providing opportunities to conserve energy that might otherwise be expended moving the dielectric fluid through the inactive portion 14b of the tank 14. Other operative configurations will be readily perceived by those skilled in this art.

In our Second Parent Provisional, we have disclosed another embodiment comprising a more conventional, less-modularized instantiation with appropriate flow and control facilities. In this embodiment, we chose to implement tank clusters, comprising, e.g., 4 appliance immersion tank facilities, with substantially all of the other equipment being constructed from stand-alone, commercially available components. Such an arrangement offers greater opportunities to select and install improved components, or to add enhancements to the installation, as deemed desirable after initial installation. Other operative configurations will be readily perceived by those skilled in this art.

As we noted above with reference to the embodiment illustrated in FIG. 12, the secondary flow header facility is well adapted to allow any secondary circulation sub-facility 30 to be connected to any active heat exchanger 32. Such a facility provides great flexibility in dealing with unusual system conditions, especially in installations wherein the secondary circulation sub-facilities 30a and 30b are each sized to support a cluster of tank modules 10. Imagine, for example, that, while one of the secondary circulation facilities 30, say sub-facility 30a, is being serviced, the activities of the set of appliances 16 in one tank 14 in the cluster are higher than normal, resulting in a rise in temperature in that tank 14 above the desired maximum. In response, the master controller 62 can direct Primary Controllers 58a and 58b assigned to tank 14 to operate both of the primary circulation sub-facilities 28a and 28b simultaneously, i.e., in parallel. Using the secondary flow header facility, the heat being extracted by both of the heat exchangers 32a and 32b may be dissipated using the resources of the single on-line secondary circulation sub-facility 30b. Thus, one clear advantage of this alternate embodiment is the ability dynamically to perform load balancing across all system resources. Other operative configurations to support sub-system load balancing will be readily perceived by those skilled in this art.

Preferably, one or more filters (not shown) are included in the flow path through each of the primary circulation sub-facilities 28a and 28b to remove any particulates or other undesirable foreign matter that may have been picked up by the dielectric fluid on its passage though the entire primary circulation facility 28; chemical sensors may also be provided to detect the presence of unexpected chemicals that may indicate failure of sub-components within one of the appliances 16. Similar components, such as pH sensors, may also included in the secondary fluid circulation facility 30.

As can be seen generally in FIG. 1, we provide a pair of low dielectric fluid level sensors 70a and 70b adapted to trigger an alarm signal in the event that, for whatever reason, the level of the dielectric fluid in the tank 14 drops below a predetermined minimum level. Additionally, the responsive primary controller 58 can initiate other actions to address the detected problem, including activating audio alarms, transmitting electronic alert signals and the like.

To solve a reciprocal problem, namely leakage from an external portion of the primary circulation loop 28 resulting in the dielectric fluid in the tank 14 being back-siphoned through the plenum facility 36, we recommend incorporating a siphon breaker 72 (see, FIG. 1) in the supply pipe at a predetermined location well above the plenum facility 36 but somewhat below the level of the weir 24. Such a siphon breaker can be as simple as a relatively small diameter hole 72 drilled through the supply pipe at the selected location; due to the relatively high viscosity of the dielectric fluid, even when heated, any resulting leakage during normal operation will be relatively insignificant. Other operative responses to address these and other unusual fluidic conditions will be readily perceived by those skilled in this art.

As is known (see, e.g., Best), many conventional, commercially available electrical/electronic appliances include components that will not function correctly if immersed in a dielectric fluid, especially one as viscous as mineral oil: cooling fans and rotating media disk drives. In general, all cooling fans are unnecessary in an immersion cooling system and can be simply removed. The media drives, however, are usually necessary for normal appliance operation. One option is to remove each drive, totally seal the drive against fluid entry, and reinstall the now-sealed drive (pre-sealed drives are also available). Another option is to remove the drive and mount it on the interconnect panel facility 24; typically special cabling will be required to re-attach the drive to the internal appliance socket. Yet another option is to replace the rotating media drive with a solid-state drive having no moving components. Other operative configurations will be readily perceived by those skilled in this art.

It will be recognized that, in all of the embodiments described herein, emphasis was placed on minimizing the total volume of the dielectric fluid circulating throughout each immersion module 10. We submit that the key concept here is to move the secondary fluid to the point of heat exchange with the primary fluid, rather than to move the primary fluid to the point of heat exchange with the secondary fluid. Thus, in our preferred embodiment, all of the essential components of the primary circulation facility 28 are tightly co-located with the tank 14 so as to form a highly-integrated module. Further, our placement of the reservoir 42 outside of (but immediately adjacent to) the tank 14 tends to reduce the total volume of the dielectric fluid (as opposed to the alternative arrangement we proposed in our First Provisional, wherein a recovery trough was disposed within the tank 14); then, we positioned the components comprising the primary circulation sub-facilities 28 so as to be vertically beneath the footprint of the reservoir 42. In addition to conserving valuable floor space in a typical data center installation, the resulting modular configuration facilitates both easy initial installation and subsequent upgrade to efficiently satisfy increasing data center workloads. Indeed, our invention greatly enhances system scalability, a key concern to data center operators. Finally, our system-wide redundancy substantially assures fail-soft operation during periods of unusual environmental conditions, infrastructure instability or political unrest.

Although we have described our invention in the context of particular embodiments, one of ordinary skill in this art will readily realize that many modifications may be made in such embodiments to adapt either to specific implementations. By way of example, it will take but little effort to adapt our invention for use with electronic appliances other than contemporary servers; and to adjust the dimensions of the appliance accommodation slots accordingly. Similarly, practitioners in the art will readily recognize that other, known secondary circulation facilities may be employed effectively, including forced air, vapor compression systems, earth-water sink loops, waste heat recovery and recycling systems, and the like (see, e.g., the several alternatives discussed in Best). Further, the several elements described above may be implemented using any of the various known manufacturing methodologies, and, in general, be adapted so as to be operable under either hardware or software control or some combination thereof, as is known in this art.

Thus it is apparent that we have provided an improved system and method of operation for immersion cooling of appliances and the like. In particular, we submit that such a method and apparatus provides performance generally comparable to the best prior art techniques but more efficiently and effectively than known implementations of such prior art techniques.

What I claim is:

1. An appliance immersion cooling system comprising:
  a tank comprising a plurality of appliance slots, wherein the tank is adapted to immerse a plurality of electrical appliances in a dielectric fluid, each of the plurality of electrical appliances corresponding to a respective appliance slot of the plurality of appliance slots, wherein the plurality of appliance slots are distributed vertically along, and extending transverse to, a selected wall of the tank, the tank comprising:
    a weir, integrated horizontally into the selected wall of the tank adjacent all appliance slots of the plurality of appliance slots, having an overflow lip adapted to facilitate substantially uniform recovery of dielectric fluid dispensed upwardly through each of the plurality of appliance slots;
a primary circulation facility adapted to circulate the dielectric fluid through the tank, the primary circulation facility comprising:
a plenum, positioned adjacent to a bottom of the tank, wherein the plenum is adapted to dispense the dielectric fluid substantially uniformly upwardly through a plurality of orifices associated with each of the plurality of appliance slots;
a secondary fluid circulation facility adapted to extract heat from the dielectric fluid circulating in the primary circulation facility, and wherein the secondary fluid circulation facility is adapted to dissipate the heat extracted from the dielectric fluid to the environment; and
a control facility adapted to coordinate operations of the primary circulation facility and the secondary fluid circulation facility.

2. The appliance immersion cooling system of claim 1, wherein at least a portion of the primary circulation facility is adjacent to the tank.

3. The appliance immersion cooling system of claim 1, wherein the tank further comprises:
an interconnect panel facility adapted to mount appliance support equipment.

4. The appliance immersion cooling system of claim 1, wherein the primary circulation facility further comprises:
at least first and second primary circulation sub-facilities, each adapted to operate independently to circulate the dielectric fluid through the tank; and
wherein the control facility is further adapted to coordinate the operations of the at least first and second primary circulation sub-facilities and the secondary fluid circulation facility to maintain the temperature of the dielectric fluid in the tank substantially between a predetermined minimum temperature and a predetermined maximum temperature.

5. The appliance immersion cooling system of claim 1, wherein the control facility further comprises a communication facility adapted to facilitate monitoring and control of the control facility from a remote location.

6. A tank module adapted for use in an appliance immersion cooling system, the tank module comprising:
a tank comprising a plurality of appliance slots, wherein the tank is adapted to immerse a plurality of electrical appliances in a dielectric fluid, each of the plurality of electrical appliances corresponding to a respective appliance slot of the plurality of appliance slots, wherein the plurality of appliance slots are distributed vertically along, and extending transverse to, a selected wall of the tank, the tank module comprising:
a weir, integrated horizontally into the selected wall of the tank adjacent all appliance slots of the plurality of appliance slots, having an overflow lip adapted to facilitate substantially uniform recovery of dielectric fluid dispensed upwardly through each of the plurality of appliance slots;
a primary circulation facility adapted to circulate the dielectric fluid through the tank, the primary circulation facility comprising:
a plenum, positioned adjacent to a bottom of the tank, wherein the plenum is adapted to dispense the dielectric fluid substantially uniformly upwardly through a plurality of orifices associated with each of the plurality of appliance slots; and
a control facility adapted to control operations of the primary circulation facility.

7. The tank module of claim 6, wherein at least a portion of the primary circulation facility is adjacent to the tank.

8. The tank module of claim 6, wherein the tank further comprises an interconnect panel facility adapted to mount appliance support equipment.

9. The tank module of claim 6, wherein the primary circulation facility further comprises:
at least first and second primary circulation sub-facilities, each adapted to operate independently to circulate the dielectric fluid through the tank;
wherein the control facility is further adapted to coordinate operations of the first and second primary circulation sub-facilities to maintain the temperature of the dielectric fluid in the tank substantially between a predetermined minimum temperature and a predetermined maximum temperature.

10. The tank module of claim 6, wherein the control facility further comprises a communication facility adapted to facilitate monitoring and control of the control facility from a remote location.

11. A tank adapted to immerse a plurality of electrical appliances in a dielectric fluid, wherein the tank comprises a plurality of appliance slots, wherein each of the plurality of electrical appliances corresponds to a respective appliance slot of the plurality of appliance slots, wherein the plurality of appliance slots are distributed vertically along, and extending transverse to, a selected wall of the tank, the tank comprising:
a plenum, positioned adjacent to a bottom of the tank, wherein the plenum is adapted to dispense dielectric fluid substantially uniformly upwardly through a plurality of orifices associated with each of the plurality of appliance slot; and
a weir, integrated horizontally into the selected wall of the tank adjacent all appliance slots of the plurality of appliance slots, having an overflow lip adapted to facilitate substantially uniform recovery of dielectric fluid dispensed upwardly through each of the plurality of appliance slots.

12. The appliance immersion cooling system of claim 1, wherein the control facility is adapted to coordinate operations of the primary circulation facility and the secondary fluid circulation facility as a function of a temperature of the dielectric fluid in the tank.

13. The tank module of claim 6, wherein the control facility is adapted to coordinate operations of the primary circulation facility as a function of a temperature of the dielectric fluid in the tank.

14. The appliance immersion cooling system of claim 12, wherein:
at least a portion of the primary circulation facility is adjacent to the tank; and
the tank further comprises an interconnect panel facility adapted to mount appliance support equipment.

15. The appliance immersion cooling system of claim 12, wherein:
the primary circulation facility further comprises at least first and second primary circulation sub-facilities, each adapted to operate independently to circulate the dielectric fluid through the tank; and
the control facility is further adapted to coordinate the operations of the at least first and second primary circulation sub-facilities and the secondary fluid circulation facility to maintain the temperature of the dielectric fluid in the tank substantially between a predetermined minimum temperature and a predetermined maximum temperature.

16. An appliance immersion cooling system comprising:
a tank comprising a plurality of appliance slots, wherein the tank is adapted to immerse a plurality of electrical appliances in a dielectric fluid, each of the plurality of electrical appliances corresponding to a respective appliance slot of the plurality of appliance slots, wherein the plurality of appliance slots are distributed vertically along, and extending transverse to, a selected wall of the tank, the tank comprising:
  a weir, integrated horizontally into the selected wall of the tank adjacent all appliance slots of the plurality of appliance slots, having an overflow lip adapted to facilitate substantially uniform recovery of dielectric fluid dispensed upwardly through each of the plurality of appliance slots;
a primary circulation facility adapted to circulate the dielectric fluid through the tank, the primary circulation facility comprising:
  a plenum comprising:
    a plenum chamber adapted to receive the dielectric fluid pumped into the plenum; and
    a plenum plate, wherein the plenum, positioned adjacent to a bottom of the tank, is adapted to dispense the dielectric fluid substantially uniformly upwardly through a plurality of orifices in the plenum plate, wherein the plurality of orifices are vertically aligned with each of the plurality of appliance slots;
  a secondary fluid circulation facility adapted to extract heat from the dielectric fluid circulating in the primary circulation facility, and wherein the secondary fluid circulation facility is adapted to dissipate the heat extracted from the dielectric fluid to the environment; and
  a control facility adapted to coordinate operations of the primary circulation facility and the secondary fluid circulation facility.

17. The appliance immersion cooling system of claim 1, wherein the tank further comprises a dielectric fluid recovery reservoir positioned vertically beneath the overflow lip of the weir and adapted to receive the dielectric fluid as it flows over the weir.

18. The tank module of claim 6, further comprising a dielectric fluid recovery reservoir positioned vertically beneath the overflow lip of the weir and adapted to receive the dielectric fluid as it flows over the weir.

19. The tank of claim 11, further comprising a dielectric fluid recovery reservoir positioned vertically beneath the overflow lip of the weir and adapted to receive the dielectric fluid as it flows over the weir.

* * * * *